(12) United States Patent
Hougham et al.

(10) Patent No.: US 7,975,379 B2
(45) Date of Patent: Jul. 12, 2011

(54) METHOD OF MAKING A LAND-GRID-ARRAY (LGA) INTERPOSER

(75) Inventors: Gareth G. Hougham, Ossining, NY (US); Brian S. Beaman, Cary, NC (US); John S. Corbin, Austin, TX (US); Paul Coteus, Yorktown Heights, NY (US); Shawn A. Hall, Pleasantville, NY (US); Kathleen C. Hinge, Tarrytown, NY (US); Theron L. Lewis, Rochester, MN (US); Frank R. Libsch, White Plains, NY (US); Amanda E. E. Mikhail, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/462,985

(22) Filed: Aug. 11, 2009

(65) Prior Publication Data

US 2010/0173505 A1 Jul. 8, 2010

(51) Int. Cl.
*H01R 9/00* (2006.01)
(52) U.S. Cl. ............ 29/842; 29/840; 29/843; 439/66; 439/67
(58) Field of Classification Search .............. 29/832, 29/840; 324/754; 439/66, 67
See application file for complete search history.

(56) References Cited

U.S. PATENT DOCUMENTS

| 5,207,585 | A  | * | 5/1993  | Byrnes et al. ............... 439/66 |
| 5,508,561 | A  | * | 4/1996  | Tago et al. ................. 257/737 |
| 5,889,326 | A  | * | 3/1999  | Tanaka ...................... 257/737 |
| 6,156,484 | A  | * | 12/2000 | Bassous et al. ............. 430/313 |
| 6,543,674 | B2 | * | 4/2003  | Lee et al. ................ 228/180.22 |
| 6,881,072 | B2 | * | 4/2005  | Egitto et al. ............... 439/67 |
| 6,970,005 | B2 | * | 11/2005 | Rincon et al. ............. 324/754 |
| 6,981,317 | B1 | * | 1/2006  | Nishida ..................... 29/840 |
| 7,292,055 | B2 | * | 11/2007 | Egitto et al. ............. 324/754 |
| 7,511,518 | B2 | * | 3/2009  | Egitto et al. ............. 324/754 |
| 7,759,795 | B2 | * | 7/2010  | Kim et al. ................. 257/737 |
| 2006/0033100 | A1 | * | 2/2006 | Kokubo et al. .............. 257/48 |
| 2007/0069743 | A1 | * | 3/2007 | Inoue et al. .............. 324/754 |

* cited by examiner

*Primary Examiner* — C. J Arbes
(74) *Attorney, Agent, or Firm* — Thomas A. Beck; Daniel P. Morris (57) ABSTRACT

LGA connectors are fabricated with buttons or spring contacts preformed to different heights to accommodate the initial topography of a typical module or PCB of a particular product type. This is accomplished during fabrication by measuring topographies of mating surfaces of a first electronic device and of a second electronic device; fabricating interposer contacts to form opposing non-planar sides having respective inverse topographies for contacting the mating surfaces; and sandwiching the interposer between the first and second electronic devices with the opposing sides in contact with respective mating surfaces.

8 Claims, 10 Drawing Sheets

PRIOR ART

FIG. 4

PRIOR ART

METHOD OF MAKING A LAND-GRID-ARRAY (LGA) INTERPOSER

GOVERNMENT RIGHTS

This invention was made with Government support under Contract No.: NBCH3039004, DARPA awarded by Defense, Advanced Research Projects Agency. The Government has certain rights in this invention.

RELATED APPLICATIONS

This application claims priority under 35 U.S.C. §119(e) as a non-provisional application of related provisional U.S. patent application Ser. No. 60/715,236, filed 8 Sep. 2005, entitled "Topography Compensating LGA".

U.S. patent application Ser. No. 11/327,726, entitled "Performance Optimized Heterogeneous Contact Array", filed concurrently herewith is assigned to the same assignee hereof and contains subject matter related, in certain respect, to the subject matter of the present application.

The above-identified patent applications are incorporated herein by reference.

TECHNICAL FIELD OF THE INVENTION

This invention relates to circuit interconnections. More particularly, it relates to Land Grid Array interposers (LGA) for connecting modules to substrates in electronic packages.

BACKGROUND ART

Land Grid Array interposers (LGA) are an important class of area-array socket connectors used to reversibly connect a chip module to a printed circuit board (PCB, PWB). They consist of a two-dimensional array of contacts, each of which spans from one side of an insulating carrier plane to the other, is compliant and conducts electricity from one extreme end point on the contact to the other extreme. LGAs are typically held under force sandwiched between a chip module and a printed wiring board. The force is typically provided by an external spring and hardware system.

While offering many advantages, LGAs do suffer from some problems, notably, a wide distribution of forces across the array resulting from non-planar mating surfaces of the module bottom and/or the PCB top. This can lead to unreliable electrical performance. This mating surface nonuniformity may stem from inherent warp in the PCB or chip module, dynamic bending under the applied load, non-uniformity in the applied load, or any combination of these factors.

LGA contacts are made to be compliant in order to accommodate some mating surface nonuniformity. Nonetheless, an unfavorable distribution of button forces is found in practice. This becomes worse as the size of the array becomes larger, with smaller applied forces, and with decreased rigidity and planarity of the module and PCB materials. This is particularly problematic in organic packaging modules of the SLC type which suffer from poor initial planarity, low rigidity, and is limited to the use of low applied force to minimize internal damage to module circuitry.

SUMMARY OF THE INVENTION

In accordance with a first aspect of the invention, an array of electrical contacts for connecting to an electronic device includes a contact having a height substantially equal to a z-dimension at a corresponding xy position on the electronic device to which it will be mating, the z-dimension being substantially equal to a deviation from planarity at that position determined with respect to a plurality of electronic electronic devices.

In accordance with a further aspect of the invention, a land grid array interposer (LGA) for interconnecting mating parts of two electronic devices includes a first side of the interposer having an array of contacts of varying heights substantially equal to a dimensions corresponding to deviations from planarity of a first mating part of one type; and a second, opposing side of the interposer having has an array of contacts of varying heights substantially equal to a dimension corresponding to deviations from planarity of a second mating part of a second type.

In accordance with a further aspect of the invention, a method for making an LGA interposer includes steps for measuring topographies of mating surfaces of a first electronic device and of a second electronic device; fabricating interposer contacts to form opposing non-planar sides having respective inverse topographies for contacting the mating surfaces; and sandwiching the interposer between the first and second electronic devices with the opposing sides in contact with respective mating serfaces.

In accordance with a further aspect of the invention a method for manufacturing a topographically sculptured LGA interposer for use with multichip modules comprises measuring an average topography of a module I/O surface; building and applying to the module an LGA interposer having a topography that is the inverse of the average topography; actuating to mate the module I/O surface and the LGA interposer.

DESCRIPTION OF THE BEST MODE

In accordance with the preferred embodiment of the invantion, LGA connectors are fabricated with the buttons preformed to different heights to accommodate the initial topography of a typical module or PCB of a particular product type.

This is easily accomplished during fabrication. For those LGA types made by molding techniques such as the metal-in-polymer type (eg. Tyco Electronics MPI, or Shin Etsu RP) or the Metal-on-Elastomer type (IBM), using molds with the desired topography provides the desired LGA topography. For those LGAs made of metal springs, cantilevers, armatures and the like, the desired topography is imposed by shaping of the buttons during or after fabrication using a sizing die with the desired topography. Sizing of metal contact types is routinely done today for metal beam LGA contacts in order to planarize them by compressing the contacts through the yield point to achieve a planar array.

The advantage of a more uniform distribution of forces across the LGA array is increased reliability of the interconnection at any given total applied force. This will be especially important for low force LGAs where even small non-uniformities could bring some buttons below a minimum threshold for reliable contact force. This is also especially important with organic packaging since the nonplanar topography of the module BSM is more severe than in ceramic, the organic substrate is far more flexible than ceramic, and where low actuation forces are important to prevent undue module flex.

In accordance with the present invention, the LGA contacts are preformed such that the contacts collectively constituting the array have a topography on one side that matches the average of module (average within a product) and on the other side that matches the average topography of a typical printed circuit board in the I/O pad area. So, rather than a standard planar array of compliant contacts having to conform through the entire deviation from planarity of a mating surface, it will instead have to conform only through a smaller deviation between the topography of the individual module and the average (mean) topography for that module type. To do this, each contact in the array is formed during fabrication to possibly different heights.

Figure 1:
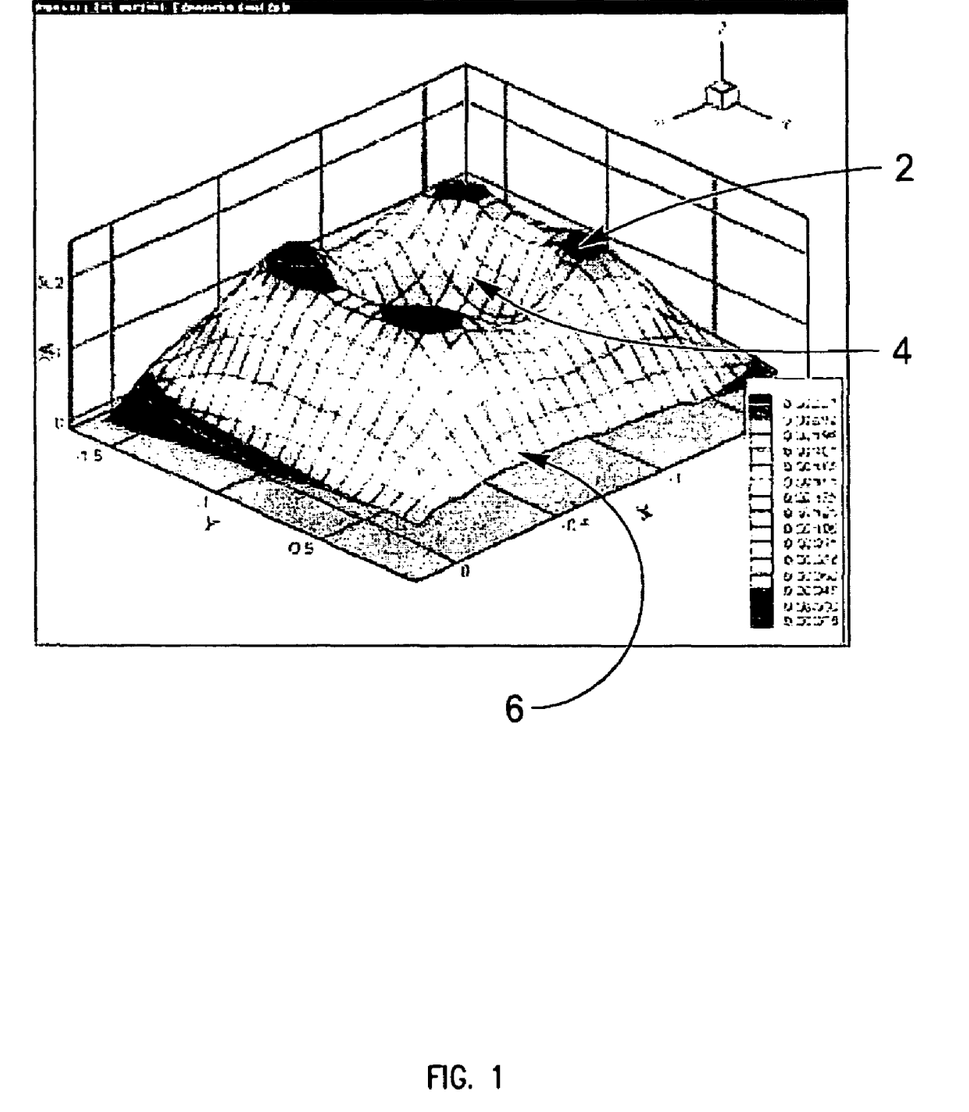
FIG. 1 is an isometric topographic view of the bottom surface of a lidded organic (SLC) single chip module showing the characteristic shape of the mating surface for LGA connection to this array of I/O, with the z-scale exaggerated for illustration.

Referring to FIG. 1 an isometric topographic view of the bottom surface of a lidded organic (SLC) single chip module is shown. This shows the characteristic shape of the mating surface for LGA connection to this array of I/O that occupies this area of the module. Z-scale has been exaggerated for illustration. The volcano shape is formed as a result of the competing coefficients of expansion and dissimilar component rigidities. The four highest points 2 are located in the chip shadow at the chip corners, the hole 4 in the center is centered on the chip, and the low points 6 around the perimeter are due to the module being adhered to a rigid lid.

Figure 2:
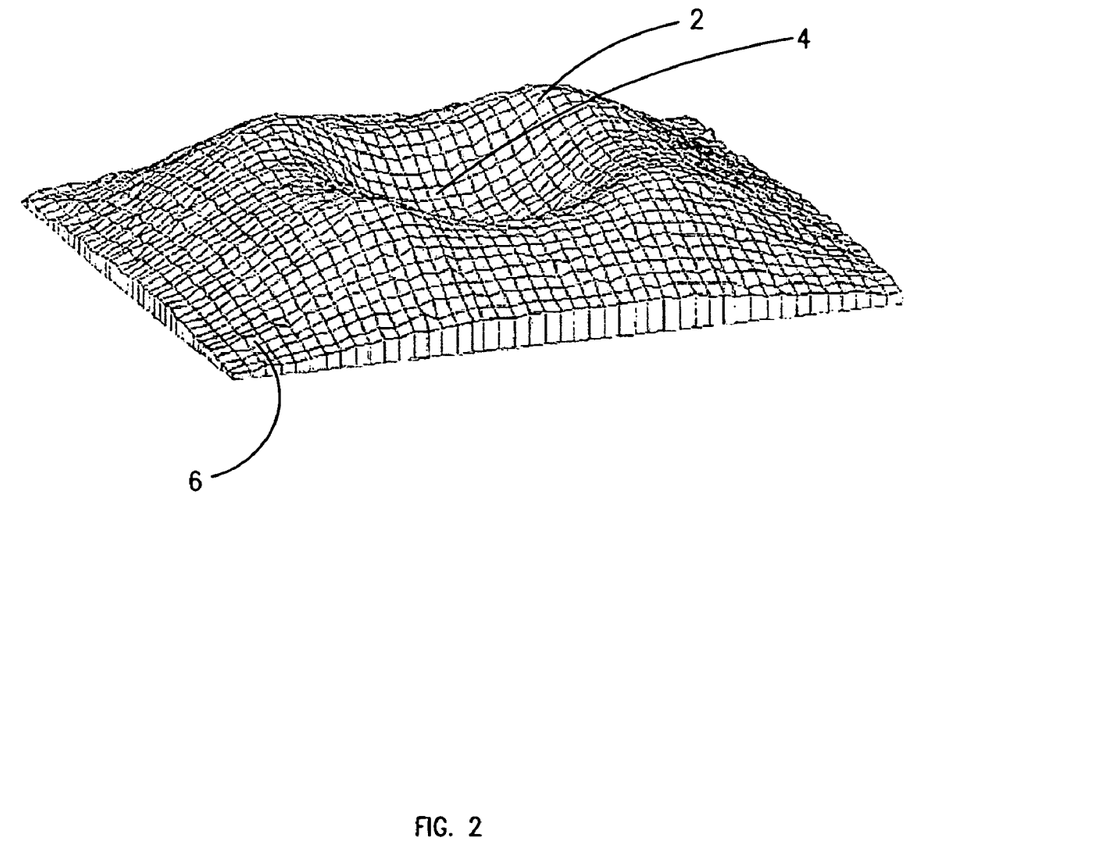
FIG. 2 is an isometric view of the same assembly as FIG. 1 but at different z-scale. The z-dimension is still exaggerated for illustration.

Referring to FIG. 2, an isometric view is shown of the same assembly as FIG. 1 but at different z-scale. The z-dimension is still exaggerated for illustration but approaches a more realistic representation.

Figure 3:
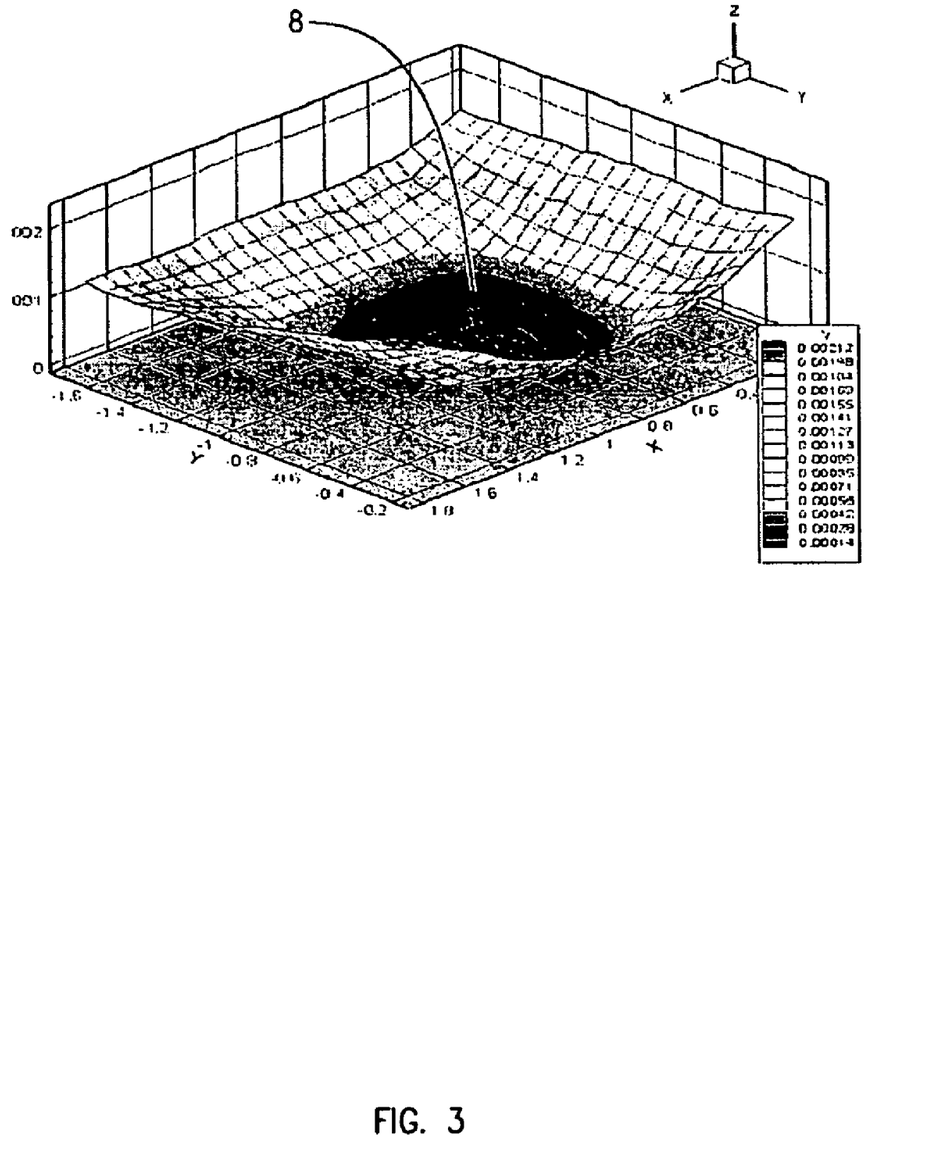
FIG. 3 is an isometric topographic view of the top surface of a printed circuit board (PCB). This shows a characteristic shape of the mating surface for LGA connection to this array of input/output pads (I/O).

Referring to FIG. 3, an isometric topographic view of the top surface of a printed circuit board (PCB) is illustrated. This shows a characteristic dish shape (concave) of the mating surface for LGA connection to this area that is occupied by an array of I/O. The center 8 of the area where the LGA will mate lies below the plane of the PWB. While printed wiring boards can adopt other shapes such as convex or saddle shape, this concave shape is most commonly seen.

Figure 4:
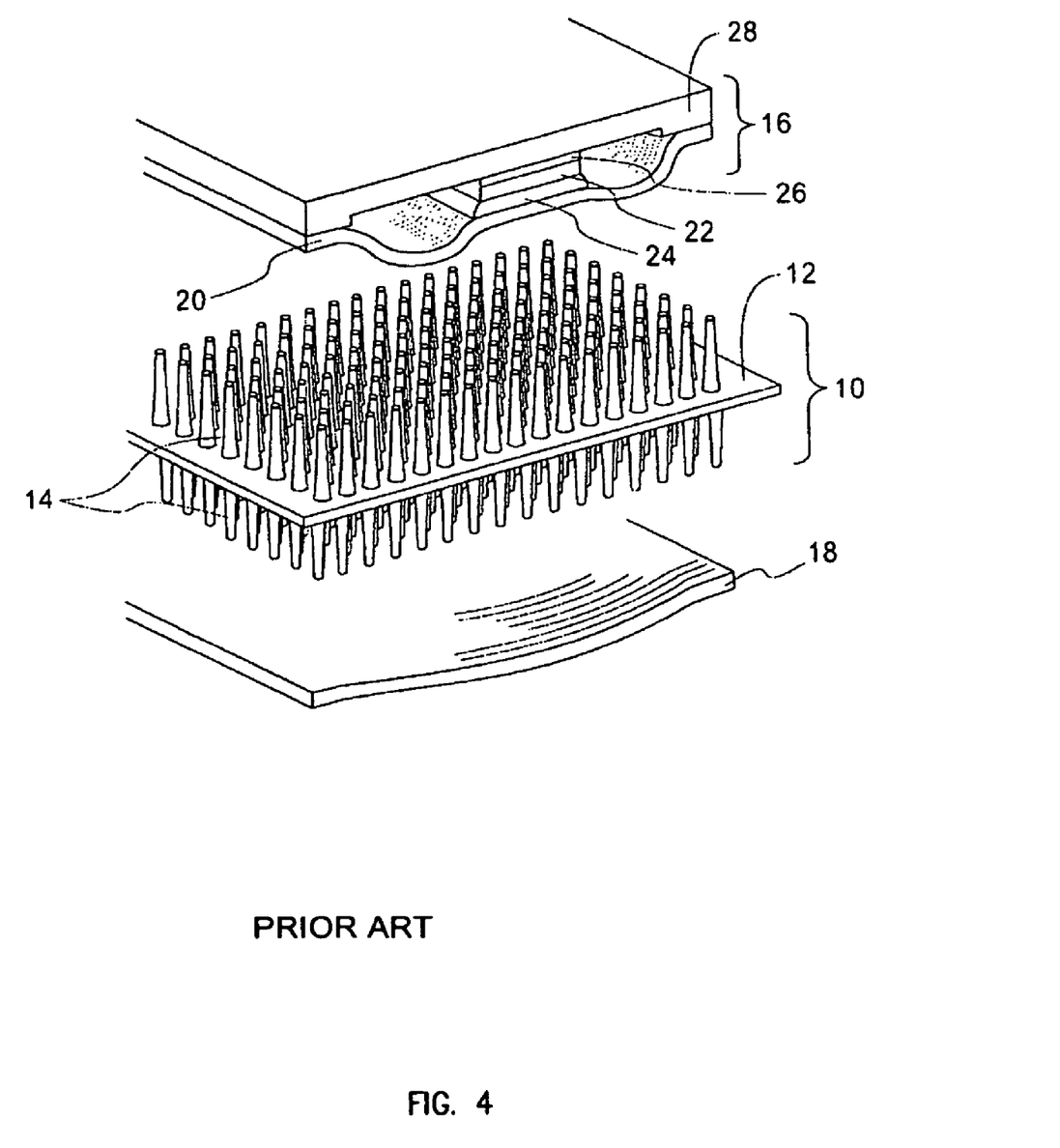
FIG. 4 is an exploded isometric view showing a standard planar land grid array interposer (LGA) between a lidded organic module and a printed circuit board before actuation where parts are brought into contact.

Referring to FIG. 4, an exploded isometric view shows an ordinary standard planar land grid array interposer (LGA) 10 which includes an insulating carrier plane 12 and electrically conducting compliant buttons or contacts 14 between a lidded organic module 16 and a printed circuit board. 18. The lidded organic module 16 includes an organic module or SLC 20 shown in the distorted shape as described by FIGS. 1 and 2, a silicon chip 22 and the associated under fill fillet 24; the thermal interface material 26 and the lid 28. Not shown are electrical pads on the module bottom or the PWB top which would be connected in associated pairs using a single LGA button or contact 14.

The view of FIG. 4 is shown in a condition before application of a force whereby parts are brought into contact. In this initial condition all the LGA buttons or contacts 14 form a planar array. That is they are all the same height across the top as well as across the bottom of carrier plane 12.

Figure 5:
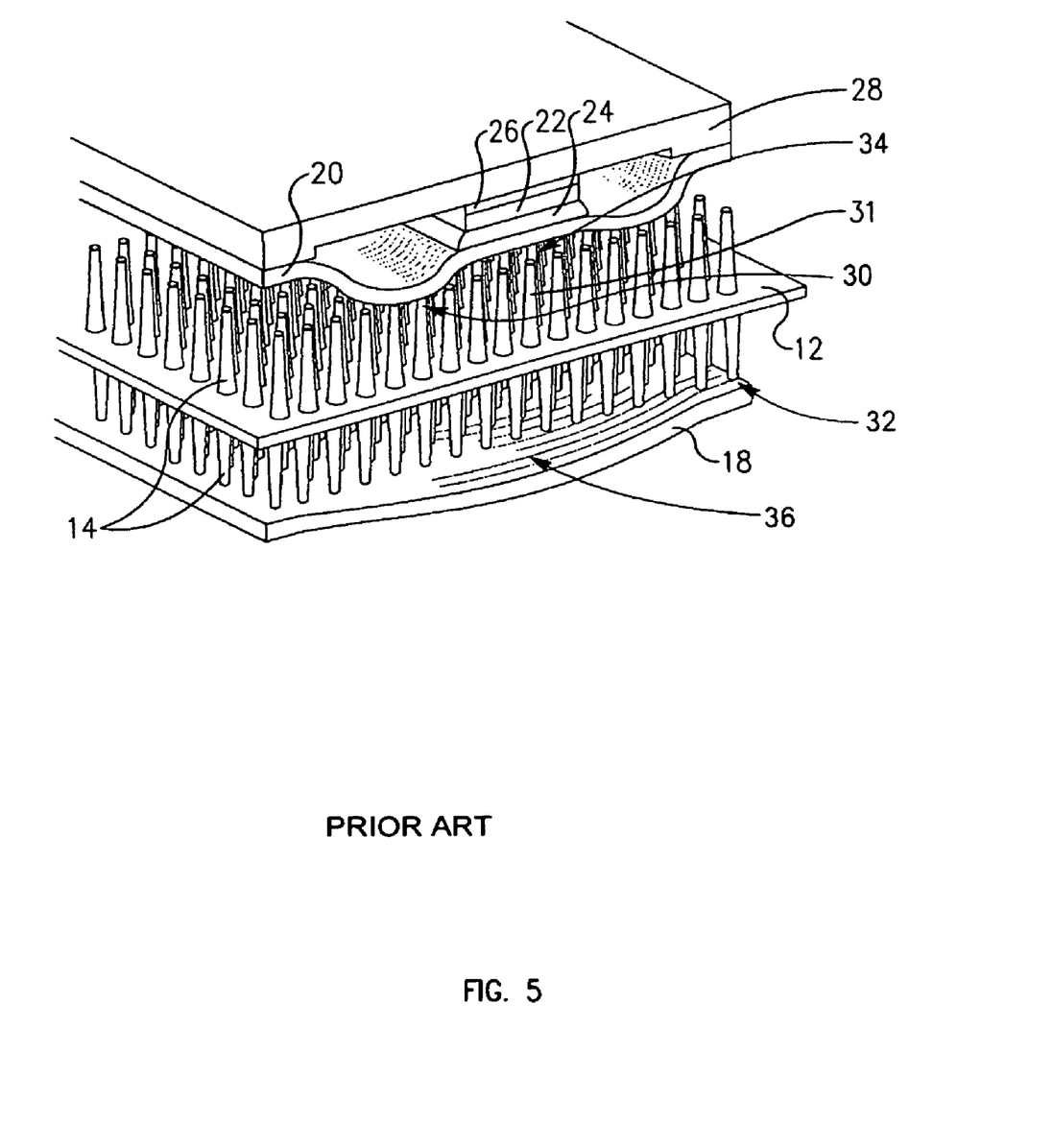
FIG. 5 is an isometric view of the same components as FIG. 4 but after actuation where parts are brought into contact. This illustrates that upon first contact the high points of the module above and the PCB below (points of greatest positive relief) will touch the LGA first, leaving gaps where the LGA is not touching the module and board. To force all I/O to make electrical contact with the associated LGA button, the stack must be compressed to an extent exceeding the gap dimension. This leads at best to an uneven distribution of forces among the LGA contacts and at worst poor contact among those least compressed. It could also lead to those that are most compressed being over stressed resulting in reliability concerns.

Referring to FIG. 5, the same components as in FIG. 4 are shown, but after actuation where parts are brought into contact. Note that upon first contact the high points of the module, above 30, and the PCB, below 32, will touch the LGA 10 first, leaving gaps 34 and 36 where the LGA is not touching the module and board. To force all I/O pads on the PWB 18 and module 16 to make electrical contact with the associated LGA button 14, the stack must be compressed to an extent exceeding the gap dimensions 34, 36. This leads at best to an uneven distribution of forces among the LGA contacts 14 and at worst to poor electrical contact among those contacts 31 least compressed. It could also lead to those contacts 30 that are most compressed being over stressed leading to reliability concerns of different types.

Figure 6:
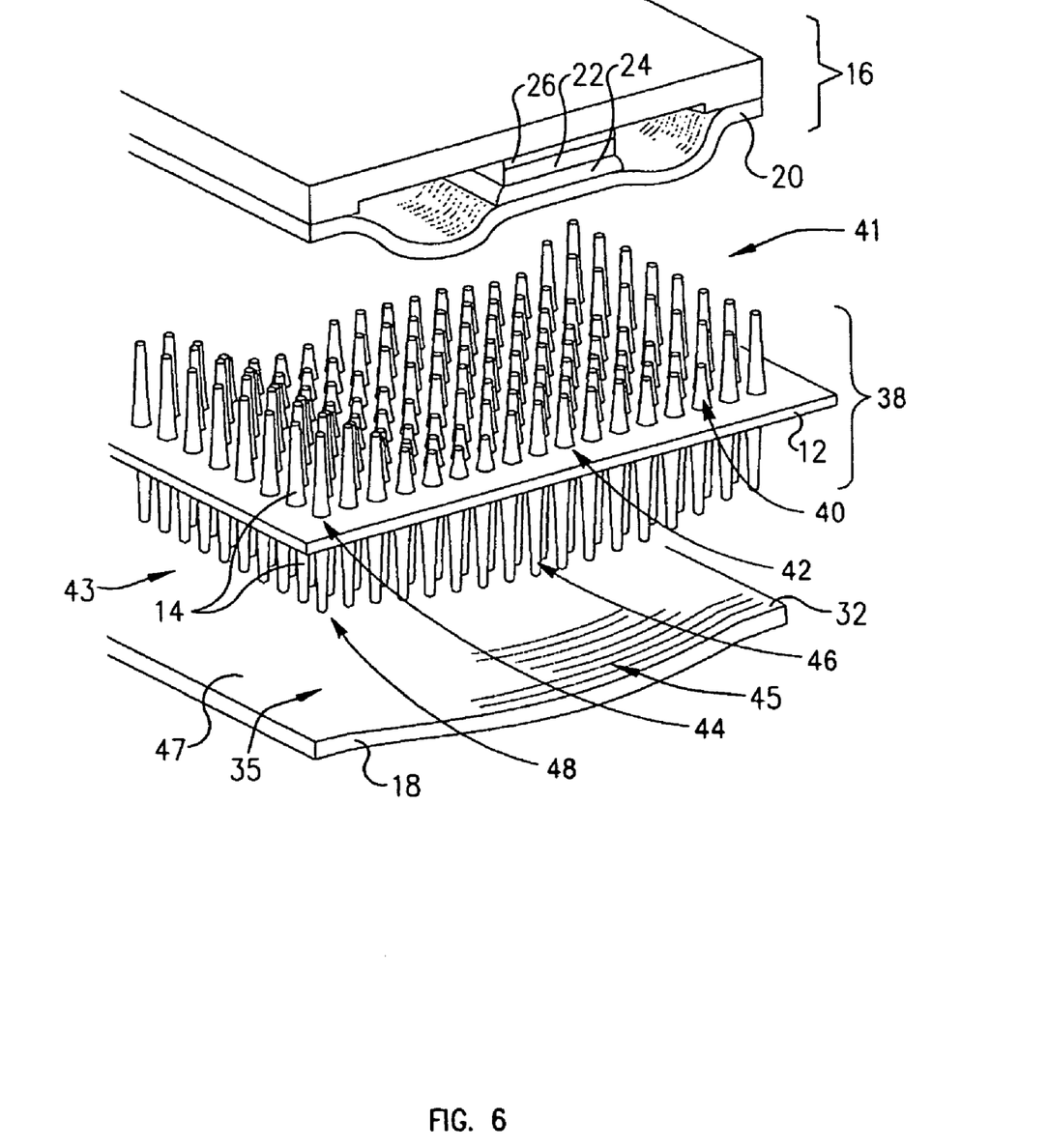
FIG. 6 is an exploded isometric view of one embodiment of the invention, and showing an LGA array with an initial topography that mimics that of the module mating surface and separately the PCB mating surface.

Referring to FIG. 6, an exploded isometric view of an embodiment of invention shows an LGA array 38 with an initial topography that mimics that of the module mating surface 33, above, and separately mimics the PCB mating surface 35, below. Notice that on the top LGA surface 41, the buttons 40 are short where the module positive relief is greatest 42 and tallest where the module relief is smallest 44. On the bottom surface 43, again the initial topography mimics that of the PWB area 35 to which it will mate. The LGA contacts are tallest 46 where the PWB 18 is most concave 45 and shortest 48 where it is least concave 47 from the plane of the PWB 18.

Figure 7:
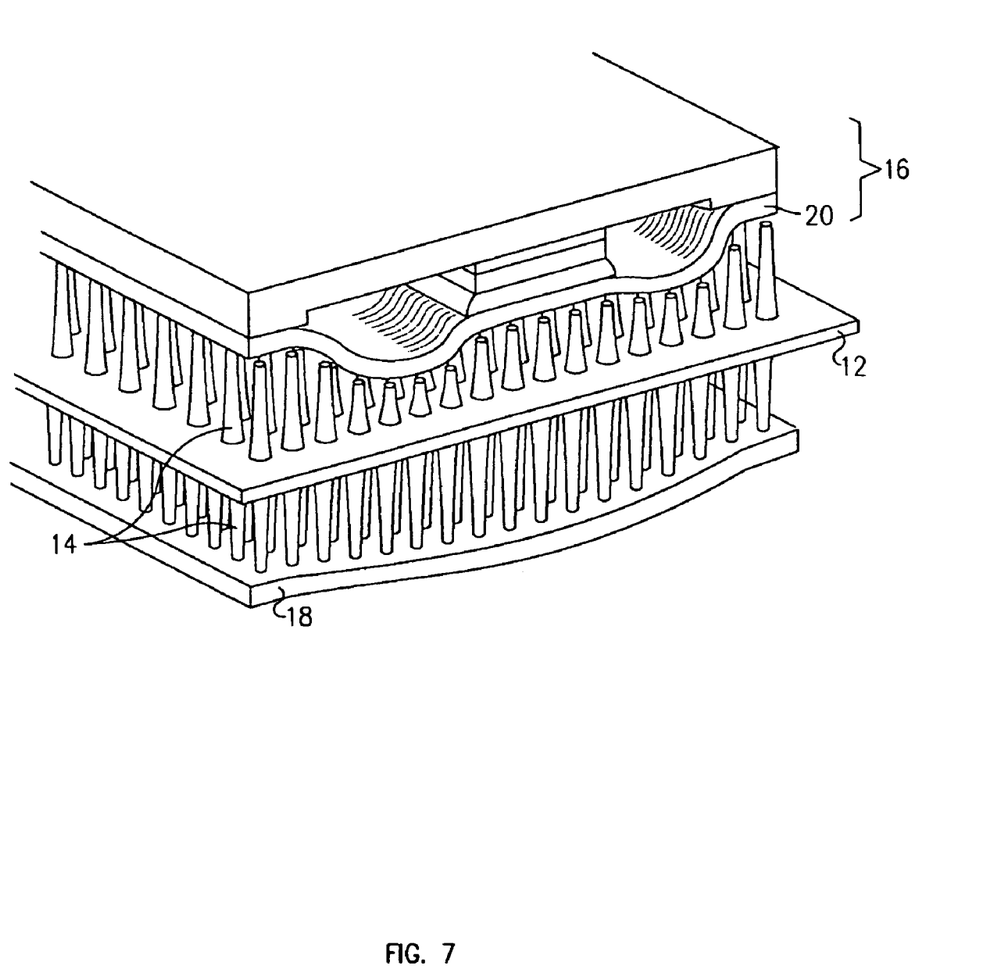
FIG. 7 is an isometric view showing the same components as FIG. 6, but after actuation where parts are brought into contact. Upon first contact, all LGA buttons touch the module and PCB I/O connections leaving no, or only minimal gaps. Slight compression beyond this first contact will ensure good electrical contact and will result in an even distribution of forces across LGA.

Referring to FIG. 7, in accordance with a preferred embodiment of the invention, the same components as FIG. 6 are shown after actuation where parts are brought into contact. (illustration shows condition just before contact with minimal and uniform gap). Upon first contact, all LGA buttons 14 touch the module 20 and PCB 18 I/O connections leaving no, or only minimal gaps. Slight compression beyond this first contact will ensure good electrical contact and will result in an even distribution of forces across LGA 38. Each button 14 being roughly compressed by the same amount will result in a substantially uniform force distribution across the LGA 38 buttons 14 in contrast to the non-uniform force distribution that would be found in the ordinary standard planar LGA types (FIG. 5).

Figure 8:
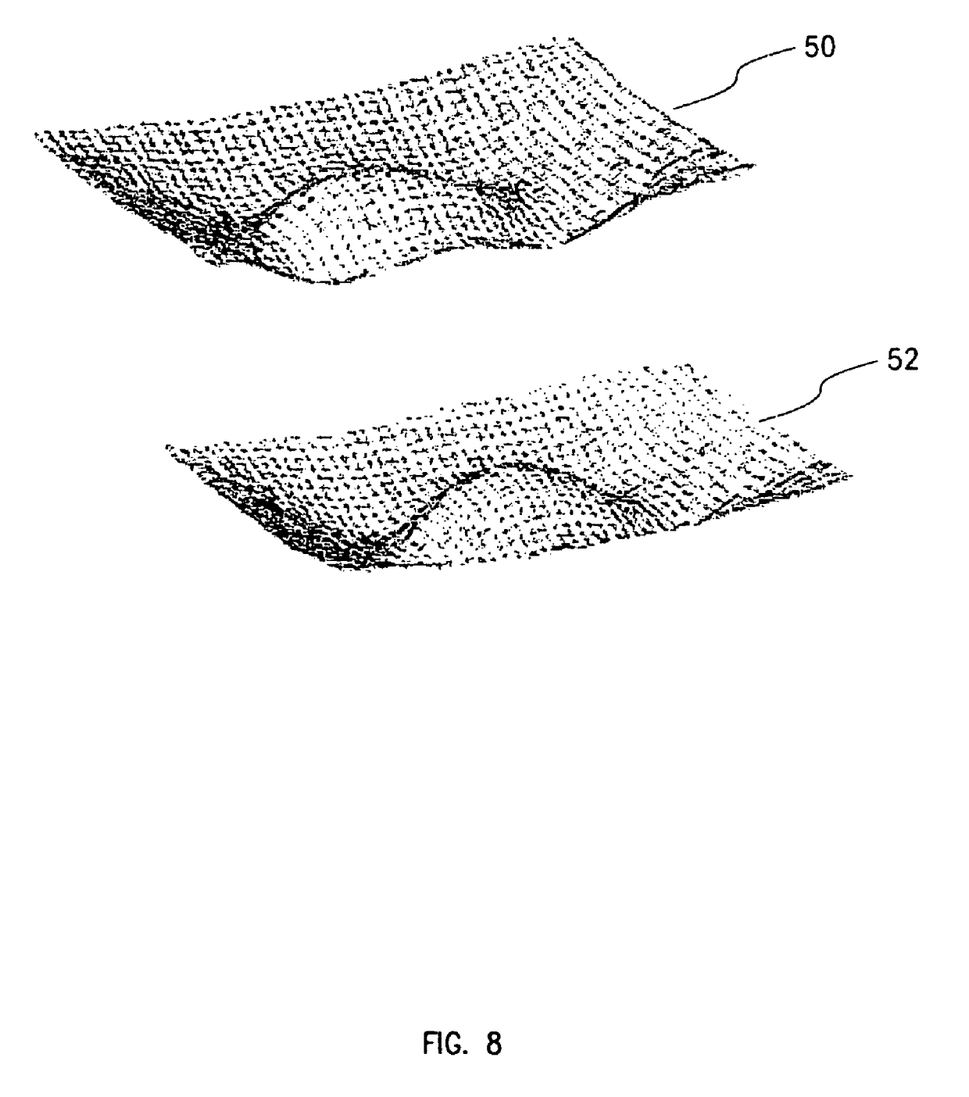
FIG. 8 shows the topography of a typical lidded organic (SLC) module above a topography representing an idealized upper half of an LGA that has been made to have an initial topography that is the inverse of the modules' mating surface topography. This is to insure that when brought together they will mate with minimal gaps and minimal force non-uniformities.

Referring to FIG. 8, the top half of figure shows the topography 50 of the mating surface 33 of a typical lidded organic (SLC) module 16, situated above a topography 52 representing an idealized upper half surface 41 of an LGA 38 that has been made to have an initial topography that is the inverse of the module's mating surface topography 33. When they mate they will closely fit one another and thus insure that they will mate with minimal gaps and minimal force non-uniformities.

Figure 9:
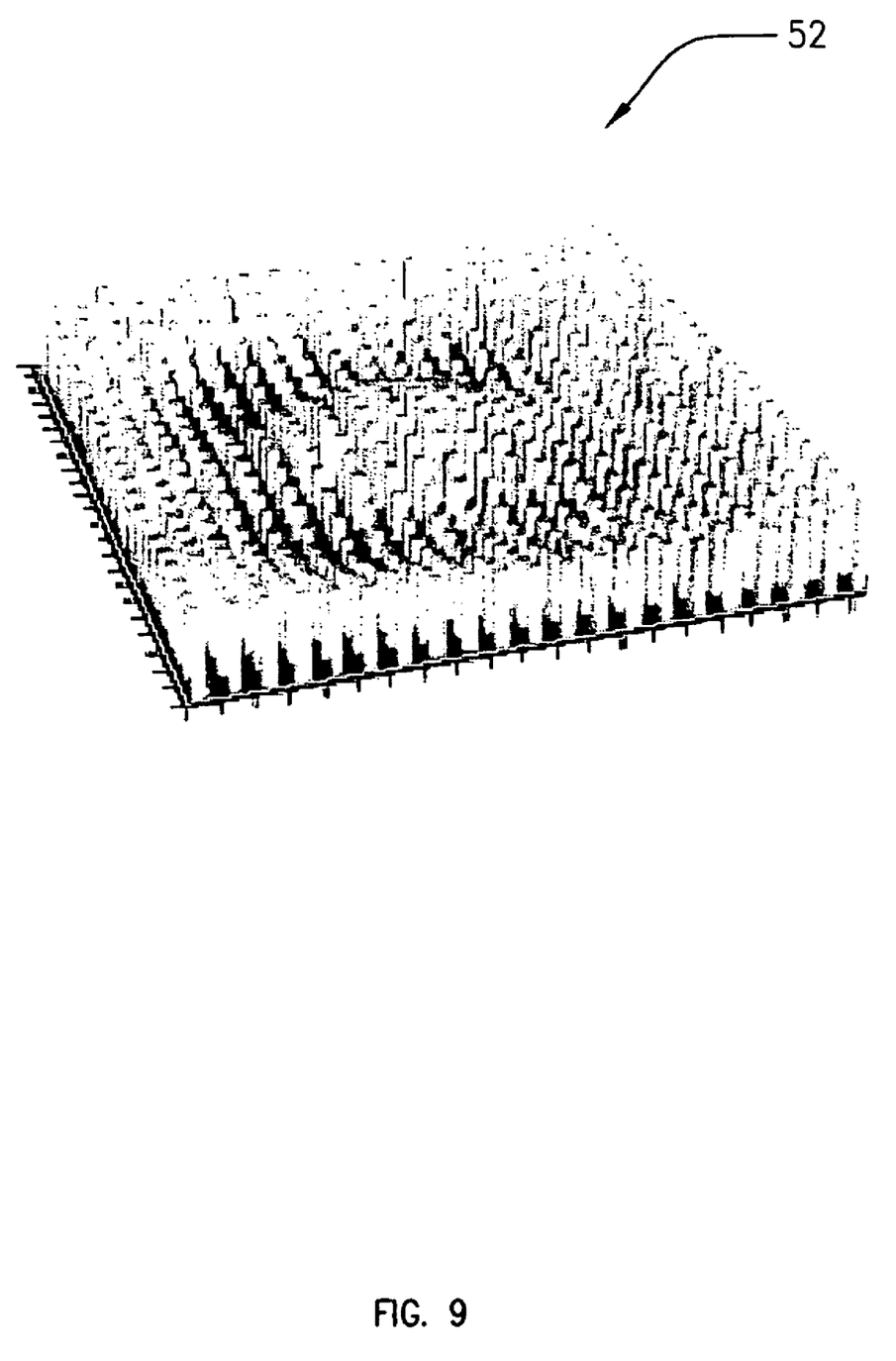
FIG. 9 represents an LGA with the topography that is the inverse of the module topography of FIGS. 1 and 2.

Referring to FIG. 9, an isometric view is presented of an LGA 38 with the topography 52 that is the inverse of the module topography of FIGS. 1 and 2, and similar to the topography of FIG. 8.

Measuring Topographies of Module or PCB Surfaces.

Figure 10:
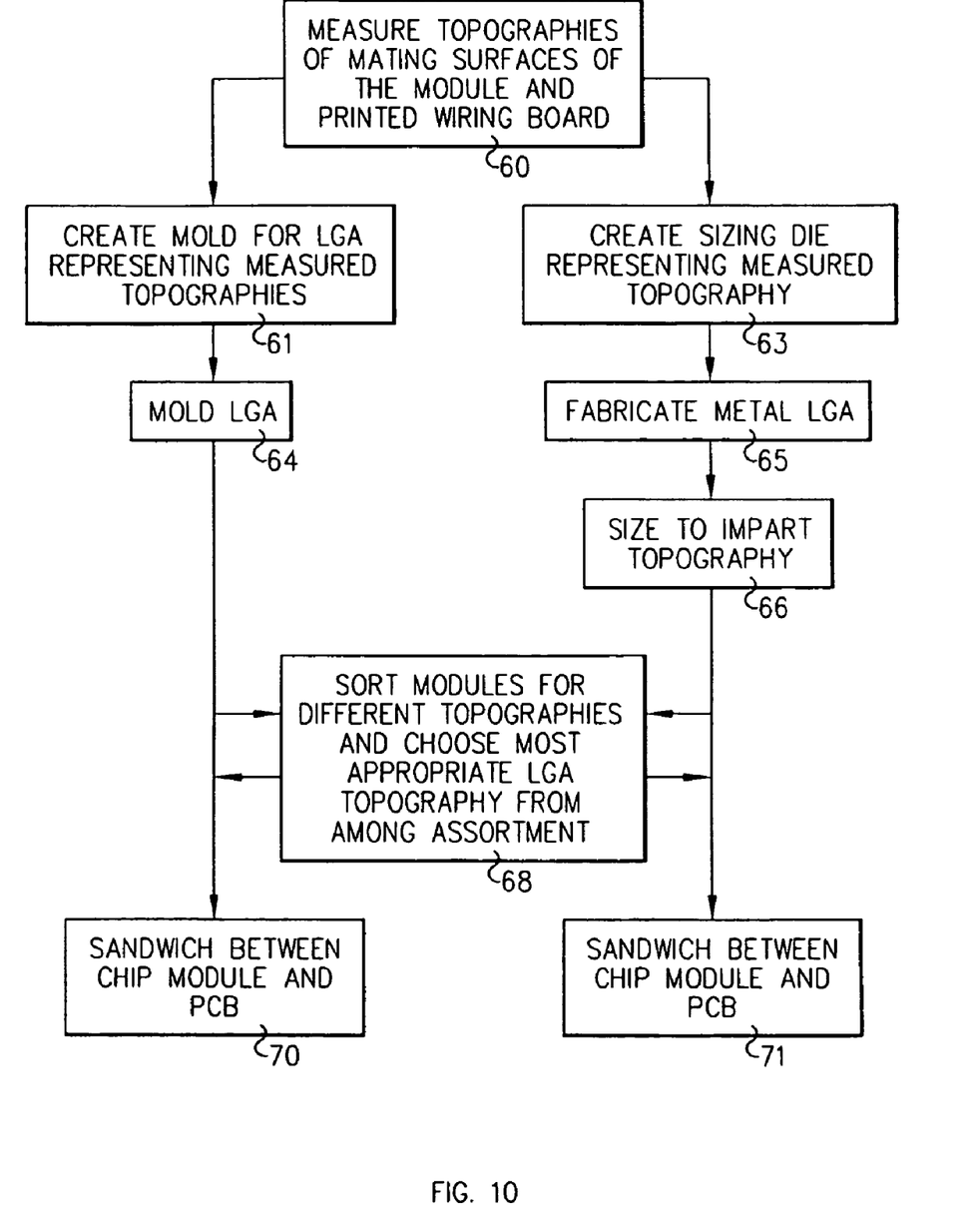
FIG. 10 is a flow chart illustrating the process steps of the preferred embodiment of the invention for manufacturing LGA interposers.

Referring to FIG. 10, a first step 60 to fabricating a topography-compensating LGA 38 is the measurement of a multitude of surfaces 33, 35 to which the LGA will be matched, to establish what is average and typical for that product.

There are two mating surfaces for an LGA 38. The bottom of the chip module 20 and the top of the printed circuit board 18. Various methods exist for measuring the topographies. In the end, an average height value for each contact position needs to be determined in order to design the mold (step 61) or sizing die (step 63).

One method which would be easy but laborious is the mechanical measurement of the distance between a reference plane and the surface 33 or 35 of interest over each I/O pad in the array. However, since many LGA arrays 38 will consist of thousands of positions, this is impractical. Another method is optical interferometry, which is highly automated and precise and for which commercially available instruments exist.

Yet another method relies on the focus adjustments necessary to bring a position into focus. This method too is highly automated, precise, and commercial instruments are available.

These measurements are typically global over the entire area 41, 43 of the array so they then need to be converted to a single height value for each I/O contact position. This step has not been available as part of the commercial offerings, but is obtainable by interpolating the topography data to each grid point in the LGA 12.

Another common method that could be applied is the use of Moire imaging for which commercial tools are available. For example, imagine a planned electronic package consisting of an organic SLC module 16 with dimensions of 55 mm×55 mm, and an array of 50×50 contacts on a 1.00 mm pitch on surface 33. The array has 2500 contacts with an unoccupied perimeter edge of 2.5 mm. This will have a particular chip attached and will have a particular stiffener and lid 28 configuration. Such a module construction will have a characteristic bottom surface topography 33 (see FIG. 1). A representative sampling of multiple nominally identical parts off the fabrication line (say 10 or 50 parts), is measured by any appropriate method, and the average deviation from a reference plane at each grid point (1.00 mm for a 1.00 mm pitch LGA) is determined.

Then, the printed circuit board 18 with which this module type 16 is planned to be combined is similarly measured on multiple parts and the height at each grid point determined and averaged.

In step 64, an LGA 38 is then fabricated where the height of each contact 44 above the carrier plane 12 corresponds to the measured average height deviation of the module 20 from a reference plane at the same grid point. Similarly, the height of the contact 48 below the carrier plane 12 at that given grid position would correspond to the average deviation of the printed circuit board from a reference plane at that grid point. The full array of contacts with the top 41 and bottom 43 halves of each contact thus corresponding to the module 20 and PCB 18 deviations from a reference plane results in the desired topography compensating LGA 38.

In step 70, as the LGA 38 is sandwiched between the chip module 20 and printed circuit board 18, the LGA nests with all the buttons contacting the I/O pads above and below it, even at negligibly low forces (FIG. 7), and provides more reliable electrical connections, especially at lower applied forces. This is in contrast to the standard LGA which, at low forces, would only make contact with the closest areas of the module and PCB and would not immediately contact those areas farther away (FIG. 5).

Further, some module types, especially organic laminate based modules and multichip modules, have topographies that differ substantially at room temperature relative to their operating temperature around 85-100 C. Thus, the LGA topography is based on some weighted average of the topographies present at the different temperatures experienced by the module. Generally, the two most common temperatures are an operating temperature near 100 C and the temperature of the room where the module will be when a computer containing it is first turned on.

Molding

Referring further to FIG. 10, one class of LGA type contacts is fabricated by molding (step 64) of the buttons 14. Molding of parts with typical conic section or columnar shapes at the 1 mm scale is most naturally done by traditional die making techniques such as drilling cavities into a metal mold that during molding are filled with the material of interest, cured, and removed for further processing.

Mold making (step 61) is also carried out using chemical etching techniques with the mold comprising, in part, an array of cavities that each have the desired dimensions for LGA buttons contributing to the array. Such individually shaped buttons collectively form a topography across the array. Upon filling the mold with an appropriate elastic curing compound, curing to crosslink, removing, and submitting to any necessary post processing, an LGA with the topography of interest is produced (step 64).

Sizing

Referring further to FIG. 10, another class of LGA type contacts is fabricated (step 62) by sizing 66. This involves inserting preformed metal contacts, stamped and formed sheet metal, into place in an insulating carrier sheet (step 65). This is done either one at a time or in groups. Typically, after the full array of contacts have been placed into the carrier, their heights vary considerably and a final step (step 66) is carried out to make them planar. To do this, the contacts are compressed against a planar die beyond their yield point. This is called sizing. In our invention, the planar die is replaced (step 63) by a die with a topography corresponding to the module I/O surface topography 33 or to other PCB topography 35. This sizing impresses the desired topographies into the top 41 and bottom 43 surfaces of the LGA 38, or to just one side or the other if only one side is desired or if a one sided compliant connector type (hybrid) is being made (step 65).

In step 71, as the LGA 38 is sandwiched between the chip module 20 and printed circuit board 18, the LGA nests with all the metal contacts contacting the I/O pads above and below it.

Another type of LGA contact 14 comprises a wire bundle. After these bundles are formed into contacts in the insulating carrier plane, a mechanical sizing operation (step 66) permanently deforms them to have the individual heights necessary to form the overall desired topographical shape (FIG. 6).

Another type of LGA contact is initially molded to a standard planar topography and then in a second step, sized to acquire the topography desired. This might involve not only compressing the contacts with a topographically shaped die (not shown, but having the same surface topology as 20 or 18), but may also require or benefit from elevated temperatures and or UV radiation to crosslink the contacts to a permanent shape.

Sorting

Referring again to FIG. 10, sorting (step 68) modules by their topographies and selecting different LGAs constitutes yet a further embodiment. This is particularly well suited to ceramic modules where the topographies from a single part number can be concave, convex, or saddle shaped. If for instance a ceramic module is being made, and the topographies of the I/O surface vary both in shape type (concave, convex, saddle) and magnitude (2 mil deviation from planar, 4 mils, 8 mil etc), different LGAs 38 could be on hand to match to the module. In this instance, one ceramic module of a concave shape 33 with 4 mil of bow is matched with an LGA with a top surface 41 that is 4 mil convex. Similarly, another individual module 16 from the same lot might have 8 mils of convex camber on surface 33. This would then be matched up with an LGA 38 with 8 mils of convex bow on surface 41. And so on.

The granularity of division is an economic choice since each LGA 38 requires different tooling to make. Even only a few choices greatly enhances the reliability of the LGA interconnect and not cost a significant amount above what manufacturing a single LGA shape costs. The sorting step is already often done to enable different mitigating strategies and so would not engender additional cost.

Alternative Embodiments

It will be appreciated that, although specific embodiments of the invention have been described herein for purposes of illustration, various modifications may be made without departing from the spirit and scope of the invention.

Following is a summary of various embodiments of the LGA interposer structure of the invention, and methods for manufacturing such LGA interposer structures.

Alternative embodiments of the invention include the following:

1. An array of electrical contacts where the heights of individual contacts are made to be equal or similar to the z-dimension at corresponding xy position on the electronic device to which it will be mating that is substantially equal to the deviation from planarity at that position; and
2. a 2-dimensional array of such contacts.
3. A land grid array interposer (LGA) including a first side having has an array of contacts of varying heights substantially equal to dimensions corresponding to deviation from planarity of a mating part of one type; and a second side having an array of contacts of varying heights substantially of equal deviation from planarity of a mating part of another, different type.
4. An LGA of alternative embodiment 3, where the topographies of the top and bottom sides have the same topography for a case where two similar parts are interconnected via the LGA.
5. An LGA where the contacts are formed by a molding operation, each contact having an individually specified height to constitute a non-planar topography overall.
6. An LGA where the contacts are made to have a desired topography by a mechanical sizing operation after the contacts have been placed into position on a carrier plane, each contact having an individually specified height to constitute a non-planar topography overall.
7. An LGA where contacts are made to have a desired topography by a mechanical sizing operation that is carried out at an elevated temperature.
8. An LGA where contacts are made to have a desired topography by a mechanical sizing operation that is carried out or followed by the application of ultraviolet light.
9. An LGA where only one side consists of compliant contacts pre-formed into a topography matching that of the electronic part to which it will be mated, and where the second side is a solderable connection similar to a ball grid array.
10. An LGA/BGA hybrid as in alternative embodiment 9 but where additionally, different amounts of solder constitute the solder balls in different parts of the array. Those areas that will be soldered to a low spot on the mating surface will have a larger solder ball, and those that will soldered to a high spot will have a small solder ball so that the effect is to fill in the nonuniformities. Thus, the solder balls before reflow will substantially mimic the topography of the mating surface.
11. An LGA with compliant contact geometries modified to tune the compression curves to further even out the force distribution. For instance, the diameter of tall elastomeric contacts could be made different from the diameter of short contacts to insure the same dimensional change upon application of the same force.
12. A method for manufacturing molds for arrays of compliant contacts where topographic information from a fabricated part, such as a chip module, is converted to a height value for contacts centered on a given pitch. For instance, if the bottom of a chip module were scanned by a topographic measurement method, this data would then be divided into a discrete number of individual height values equaling the number of contacts and taken at the position where those contacts will be.
13. A method for manufacturing molds whereby the individual heights of the contacts are drilled or etched into the mold.
14. A method for manufacturing a sizing die where the individual heights of the contacts are drilled, machined, or etched into the die.
15. Use of a topographically sculptured LGA for use with multichip modules. In this case, as with the single chip modules, an average topography of the module I/O surface needs to be measured, and either a mold or a sizing die made to create an LGA that mimics the inverse of that topography to allow close mating of the two surfaces upon actuation.
16. An LGA like that of embodiment 15 that has just one side of the insulating carrier topographically mimicking with compliant conducting contacts that of the mating surface while the other side would be made to be soldered into place (either with uniform amounts of solder or varying amounts to accommodate the topography against its mating surface).

17. A method for determining the best fit topography that uses statistical techniques that account for the spatial nature of an LGA; that is, that will determine the average and standard deviation of each contact position for a sampling of parts and then calculate the best fit inverse topography to accommodate the variation at each position accordingly to best account for random variations.

18. An LGA interposer where the diameter or other geometric feature of individual contacts is made to differ from each other to gain another degree of design control over the load distribution. Thus, contacts in one region where it is desirable to have a large compliance are made with a small diameter. Contacts in another region where it is desirable to have a smaller compliance are made with a larger diameter.

Accordingly, the scope of protection of this invention is limited only by the following claims and their equivalents.

We claim:

1. A method comprising making a land grid array (LGA) interposer to be used for mating with interior surfaces of a first electronic device and of a second electronic device, said interior surfaces of said first electronic device and of said second electronic device positioned diametrically opposite each other and being topographically non-planar throughout;
   measuring said topographies of said interior surfaces of said first electronic device and of said second electronic device by scanning a mating surface of a said first electronic device and of said second electronic device by a topographic measurement method;
   dividing a resulting data into a discrete number of individual height values equaling a number of contacts and taken at a position where said contacts will be positioned;
   fabricating said LGA in two steps:
   first: forming a rectangular insulated carrier sheet having a plurality of side edges and a continuous planar surface, an upper first surface and a lower second surface, wherein on each said surface, a two-dimensional x-y array of individual solid contacts spans from any given side of said upper first surface and from any given side of said lower second surface of said substantially rectangular insulated planar carrier sheet to a diametrically opposite side;
   said x-y array of interposer contacts on said upper first surface and said interposer contacts on said lower second surface being secured in and extending from said substantially rectangular insulated carrier sheet each said contact secured in said upper first surface array of contacts, and each said contact secured in said lower second surface array of contacts having the same or various different z dimension heights throughout said array;
   each said same or various different z dimension heights; and
   second adjusting the z height of each contact below said carrier sheet to correspond to the measured average height deviation of said first electronic device from a reference plane at an identical grid point
   and adjusting the z height of each contact above said carrier sheet to correspond to the measured average height deviation of said second electronic device from a reference plane at an identical grid point
   sandwiching said interposer between said first and second electronic devices with said opposing sides in contact with respective mating surfaces.

2. The method of claim 1, wherein said interposer contacts are formed by a molding operation, each said contact having an individually specified height within an overall non-planar topography.

3. The method of claim 1, wherein said contacts are made to have a desired topography by a mechanical sizing operation after said contacts have been placed into position on a carrier plane, each contact having an individually specified height to form an overall non-planar topography.

4. The method of claim 3, wherein said contacts are made to have a desired topography by a mechanical sizing operation that is carried out with one of simultaneous and subsequent application of ultraviolet light and at an elevated temperature.

5. The method of claim 1, further comprising: manufacturing molds for formation of arrays of compliant contacts where topographical information from a fabricated part is converted to a height value for contacts centered on a given pitch.

6. The method of claim 5, further comprising: scanning a mating surface of a chip module by a topographic measurement method; dividing a resulting data into a discrete number of individual height values equaling a number of contacts and taken at a position where said contacts will positioned.

7. The method of claim 5, further comprising manufacturing molds by selectively drilling and etching individual heights of contacts into said mold.

8. The method of claim 1, comprising adjusting said z height on the basis of a predetermined average and standard deviation of each contact position for a sampling of parts comprising said x-y array of interposer contacts, in relation to said first electronic device and said second electronic device and from said average and standard deviation, implementing a best fit inverse topography for accommodating variation at each said contact position.

* * * * *